United States Patent
Yuan et al.

(10) Patent No.: US 6,277,744 B1
(45) Date of Patent: Aug. 21, 2001

(54) TWO-LEVEL SILANE NUCLEATION FOR BLANKET TUNGSTEN DEPOSITION

(75) Inventors: Ting H. Yuan; Bob Anderson; Jin Zhao; Clive Jones, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/489,510

(22) Filed: Jan. 21, 2000

(51) Int. Cl.[7] ................................................... H01L 21/44

(52) U.S. Cl. .................... 438/685; 438/653; 438/654; 438/656; 438/674; 438/675; 438/677

(58) Field of Search ................................. 438/674, 675, 438/677, 653, 654, 656, 685

(56) References Cited

U.S. PATENT DOCUMENTS

| | | | |
|---|---|---|---|
| 4,777,150 | 10/1988 | Deneuville et al. | 437/200 |
| 5,034,791 | 7/1991 | Kameyama et al. | 357/23.9 |
| 5,071,788 | * 12/1991 | Joshi | 437/192 |
| 5,158,903 | 10/1992 | Hori et al. | 437/45 |
| 5,223,455 | * 6/1993 | Itoh et al. | 437/192 |
| 5,472,896 | 12/1995 | Chen et al. | 437/44 |
| 5,492,734 | 2/1996 | Matsumoto et al. | 427/255 |
| 5,656,529 | 8/1997 | Fukase | 438/398 |
| 5,795,824 | * 8/1998 | Hancock | 438/656 |
| 5,874,360 | * 2/1999 | Wyborn et al. | 438/680 |
| 5,906,866 | * 5/1999 | Webb | 427/534 |
| 6,037,263 | * 3/2000 | Chang | 438/712 |
| 6,066,366 | * 5/2000 | Berenbaum et al. | 427/250 |

FOREIGN PATENT DOCUMENTS

| | | | |
|---|---|---|---|
| 0068843 A2 | 1/1983 | (EP) | H01L/21/285 |
| 07263674 | 10/1995 | (EP) | H01L/29/78 |
| 2061615 | 5/1981 | (GB) | H01L/29/62 |

OTHER PUBLICATIONS

Ahn, "New Development in CVD Tungsten Technology for Multilevel Interconnection", VLSI Multilevel Interconnection Conference, Fifth International Conf., IEEE, pp. 125–134, Jun. 13–14, 1998.*

Tsutsumi et al., "A Selective LPCVD Tungsten Process Using Silane Reduction for VLSI Applications", IEEE Transactions on Electron Devices, pp. 569–567, Mar. 1990.*

D. L. Brors et al.; Properties of Low Pressure CVD Tungsten Silicide as Related to IC Process Requriements; Solid State Technology; pp. 183–186; Apr. 1983.

J. R. Creighton; Non–Selective Tungsten Chemical–Vapor Deposition Using Tungsten Hexacarbonyl; American Institute of Physics; pp. 192–201; 1988.

R. V. Joshi et al.; Mechanisms controlling temperature dependent mechanical and electrical behavior of $SiH_4$ reduced chemically vapor deposited W; Journal of Applied Physics; vol. 68; No. 11; pp. 5625–5629; Dec. 1990.

(List continued on next page.)

Primary Examiner—Matthew Smith
Assistant Examiner—Lex H. Malsawma
(74) Attorney, Agent, or Firm—Timothy M. Honeycutt (57) ABSTRACT

Various methods of fabricating a tungsten conductor structure are provided. In one aspect, a method of fabricating a tungsten conductor structure in an opening in an insulating film is provided that includes forming a titanium nitride film in the opening and heating the a titanium nitride film. The titanium nitride film is exposed to a flow of hydrogen gas and a flow of an inert carrier gas. The titanium nitride film is exposed to a flow of silane at a first flow rate for a first time interval and to a flow of tungsten hexafluoride for a second time interval that begins after the beginning but prior to the end of the first time interval. The flow of silane is reduced at the end of the first time interval to a second flow rate and maintained at the second flow rate for a third time interval. Fluorine diffusion into the titanium nitride film and the potential for void formation due to non-conformal tungsten deposition are reduced.

18 Claims, 6 Drawing Sheets

OTHER PUBLICATIONS

J. H. Sone et al.; Formation of low pressure chemically vapour dposited W thin film on silicon dioxide for gate electrode application; Thin Solid Films; vol. 253, No. 1/2; pp. 377–381; Dec. 1994.

Thomas E. Clark et al.; High Pressure Blanket CVD Tungsten–Materials Research Society; VLSI V.; pp. 167–177; Sep. 1989.

Ming L. Yu et al.; Surface reactions in the chemical vapor deposition of tungsten using $WF_6$ and $SiH_4$ on AL, PtSi, and TiN; vol. 67, No. 2; pp. 1055–1061; Jan. 1990.

Stanley Wolf and Richard N. Tauber; Silicon Processing for the VLSI Era, vol. 2—Process Integration; pp. 398–399; 1990.

E.J. McInerney et al.; The Rate Mechanisms of Silane Reduced CVD Tungsten–Materials Research Society; Conference Proceedings ULSI–VII; pp. 61–74; Oct. 1991.

Novellus Systems; Tungsten CVD Process Guide–Novellus; pp. 2:19–22; Dec. 1997.

Thomas E. Clark et al., *High Pressure Blanket CVD Tungsten–Materials Research Society,* pp. 167–177, Sep. 1989.

Ming L. Yu et al., *Surface reactions in the chemical vapor deposition of tungsten using $WF_6$ and $SiH_4$ on Al, PtSi, and TiN,* pp. 1055–1061, Jan. 1990.

Stanley Wolf and Richard N. Tauber, *Silicon Processing for the VLSI Era, vol. 2 –Process Integration,* pp. 398–399, 1990.

E.J. McInerney et al., *The Rate Mechanisms of Silane Reduced CVD Tungsten–Materials Research Society* pp. 61–74, Oct. 1991.

Novellus Systems, *Tungsten CVD Process Guide–Novellus* pp. 2:19–22, Dec. 1997.

* cited by examiner

TWO-LEVEL SILANE NUCLEATION FOR BLANKET TUNGSTEN DEPOSITION

BACKGROUND OF THE INVENTION

1. Field of the Invention

This invention relates generally to semiconductor processing, and more particularly, to a method of fabricating a tungsten conductor structure.

2. Description of the Related Art

Modem integrated circuits routinely contain millions of individual transistors and other electronic components. Most of the interconnections for the numerous individual transistors in a modern integrated circuit are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

In addition to the one or more metallization layers, modern integrated circuits also incorporate numerous routing-restricted interconnect levels commonly known as local interconnects. Local interconnects are used for short metallization runs such as those that locally interconnect gates and drains in NMOS and CMOS circuits and those that connect a given metallization layer to a particular structure in the integrated circuit.

A method frequently employed to form local interconnect structures involves a damascene process in which the substrate containing the integrated circuit is coated with a layer of dielectric material that is lithographically patterned and etched to form trenches in the dielectric layer where the local interconnect structures will be deposited. For example, a local interconnect structure intended to interconnect the source, the drain or the gate of a transistor requires a trench to be formed in the overlying dielectric layer that extends down to the source, the drain or the gate. Thereafter, a conducting contact or interconnect is formed in the trench.

Doped polysilicon and tungsten represent two conventionally used materials for global and local interconnect structures. Both materials have high melting points and thus alleviate many thermal budgeting problems associated with other commonly used conducting materials. Tungsten is frequently favored over polysilicon as its resistivity may be as much as one or more orders of magnitude lower than comparably sized doped polysilicon structures.

Despite the several advantages offered by tungsten as an interconnect material, the integration of tungsten into semiconductor processing involves a number of significant challenges. Tungsten exhibits poor adhesion to oxide. Accordingly, the conventional fabrication of a tungsten conducting structure in a trench in an oxide film requires an initial deposition of a barrier or adhesion layer on the oxide in advance of the tungsten deposition. The barrier layer material is selected to exhibit acceptable adhesion to the underlying oxide and the later-deposited tungsten film.

Titanium nitride is a common material used for a barrier layer, although other titanium based films, such as Ti:W have been used as well. In one conventional process, a thin film of titanium is deposited by physical sputtering. Thereafter a thin film of titanium nitride is deposited on the titanium by chemical vapor deposition ("CVD") or physical vapor deposition ("PVD").

In many conventional processes, the tungsten film is deposited by the CVD reduction of $WF_6$ in a silane ambient. In at least one conventional process, the barrier film is exposed to a flow of silane for short period. The initial flow of silane is stopped and thereafter the film is exposed to a simultaneous flow of silane, $WF_6$ and hydrogen. The second silane flow is maintained at a relatively constant flow rate that is designed to establish a tungsten nucleation film on the barrier layer. The difficulty with this approach is the potential for nonconformal tungsten deposition in the trench. At relatively high silane flow rates, tungsten may deposit at a higher rate near the top of the trench than at the bottom, resulting in a bridge-over of the trench opening and the creation of a void in the tungsten interconnect. Such voids may adversely impact the performance of the interconnect.

Another shortcoming of conventional tungsten interconnect processing stems from the highly reactive character of titanium and the chemistry associated with CVD tungsten. As noted above, many conventional CVD tungsten deposition processes involve the reduction of $WF_6$ in silane. This reduction process liberates quantities of fluorine which may readily diffuse into the underlying titanium-based barrier film and react with the titanium therein. The incorporation of $TiF_X$ compounds into the adhesion layer may not only degrade the resistivity of the barrier layer, but also result in the ultimate delamination of the barrier glue layer from the underlying oxide layer. This can produce not only undesirable device performance but also catastrophic device failure depending upon the extent of the delamination.

The problem of fluorine attack may be more pronounced in circumstances where the barrier film is deliberately fabricated with a small thickness or has thickness variations due to process control issues. Device scaling frequently calls for the commensurate scaling of interconnect structures. In these circumstances, an attendant decrease in barrier film thickness is normally required if acceptable levels of interconnect resistivity are to be maintained. In addition, sometimes unavoidable process control variations in the etching of the interconnect trench may produce thin spots in the barrier film. Variations in trench topography may result in variations, including thin spots, in the thickness of the deposited barrier film. These thin spots represent areas that may be particularly susceptible to fluorine attack.

The present invention is directed to overcoming or reducing the effects of one or more of the foregoing disadvantages.

SUMMARY OF THE INVENTION

In accordance with one aspect of the present invention, a method of fabricating a tungsten structure is provided that includes heating a titanium nitride film and exposing the titanium nitride film to a flow of hydrogen gas and a flow of an inert carrier gas. The titanium nitride film is exposed to a flow of silane at a first flow rate for a first time interval and exposed to a flow of tungsten hexafluoride for a second time interval that begins after the beginning but prior to the end of the first time interval. The flow of silane is reduced at the end of the first time interval to a second flow rate and maintained at the second flow rate for a third time interval.

In accordance with another aspect of the present invention, a method of fabricating a tungsten conductor structure in an opening in an insulating film is provided that includes forming a titanium nitride film in the opening and heating the titanium nitride film. The titanium nitride film is exposed to a flow of hydrogen gas and a flow of an inert carrier gas. The titanium nitride film is exposed to a flow of silane at a first flow rate for a first time interval and to a flow of tungsten hexafluoride for a second time interval that begins after the beginning but prior to the end of the first time interval. The flow of silane is reduced at the end of the first time interval to a second flow rate and maintained at the second flow rate for a third time interval.

In accordance with another aspect of the present invention, a method of fabricating a tungsten conductor structure in an opening in an oxide film is provided that includes forming a titanium film in the opening and forming a titanium nitride film on the titanium film. The titanium nitride film is heated and exposed to a to flow of hydrogen gas and a flow of an inert carrier gas. The titanium nitride film is exposed to a flow of silane at a first flow rate for a first time interval and a flow of tungsten hexafluoride for a second time interval that begins after the beginning but prior to the end of the first time interval. The flow of silane is reduced at the end of the first time interval to a second flow rate and maintained at the second flow rate for a third time interval.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
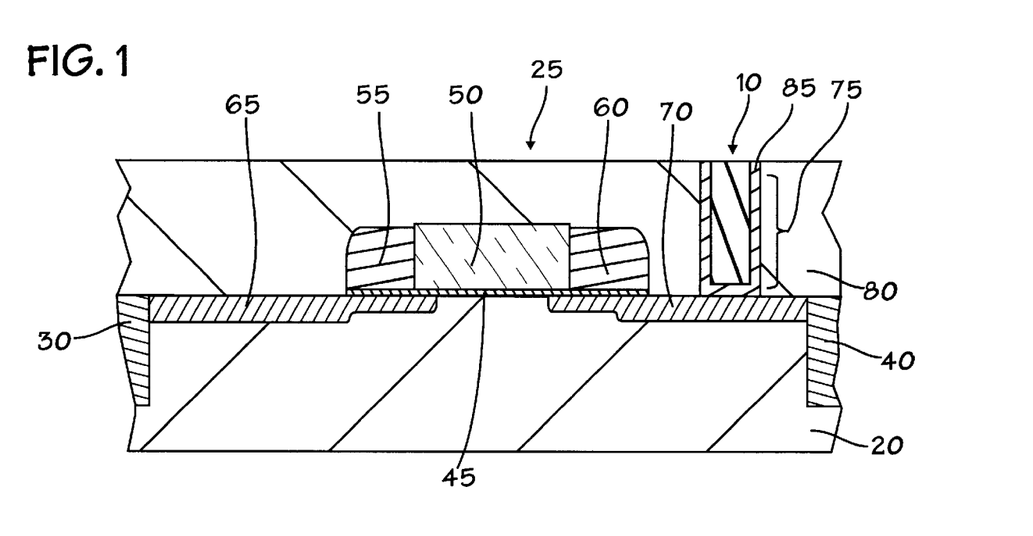
FIG. 1 is a cross-sectional view of an exemplary embodiment of a tungsten conductor structure fabricated on a substrate in accordance with the present invention.

In the drawings described below, reference numerals are generally repeated where identical elements appear in more than one figure. FIG. 1 depicts a cross-sectional view of an exemplary embodiment of a tungsten conductor structure 10 fabricated on a semiconductor substrate 20. The substrate 20 may be composed of p-doped silicon, n-doped silicon, silicon-on-insulator or other suitable substrate materials. The structure 10 is depicted adjacent to an integrated circuit transistor 25 that is fabricated on the substrate 20 and electrically isolated laterally by isolation structures 30 and 40. The isolation structures 30 and 40 may be trench isolation structures, field oxide regions or the like. The transistor 25 includes a gate insulating layer 45 formed on the substrate 20 and a gate electrode 50 formed on the gate insulating layer 45. The gate insulating film 45 may be composed of oxide, silicon nitride, laminates of these or other well known gate insulating film materials, and may be fabricated by well known techniques. The gate electrode 50 may be composed of a variety of conducting materials, such as, for example, polysilicon, amorphous silicon, aluminum, tantalum, tungsten or the like with or without silicide films, and may be applied using well known techniques. The gate electrode 50 is bracketed by a pair of insulating spacers 55 and 60, which may be oxide, silicon nitride or other well known spacer materials, and may be applied and shaped by well known techniques. A pair of dual-graded source/drain regions 65 and 70 are formed in the substrate 20 using well known techniques. The phrase "source/drain region(s)" is used herein to describe a region that may serve as either a source or a drain. The skilled artisan will appreciate that a source/drain region may function as a source or a drain depending upon how it is interconnected with subsequent metallization. The source/drain regions 65 and 70 may include silicided areas (not shown).

The tungsten conductor structure 10 is formed in an opening 75 in an interlevel dielectric layer 80 which is formed over the transistor 25. The interlevel dielectric layer 80 may be composed of oxide, tetra-ethyl-ortho-silicate ("TEOS") or other insulating materials. The opening 75 may be a via or trench suitable for accommodating a local interconnect or a conducting line or other conducting structure as desired. A titanium nitride/titanium barrier layer 85 is interposed between the tungsten conductor structure 10 and the sidewalls of the opening 75 and the underlying source/drain region 70. It should be understood that the depiction of the transistor 25 and the interlevel dielectric layer 80 in conjunction with the tungsten structure 10 is intended to be merely illustrative of the fabrication process in accordance with the present invention. The skilled artisan will appreciate the tungsten structure 10 may be used in a wide variety of situations in circuit device fabrication where a conductor structure is needed.

Figure 2:
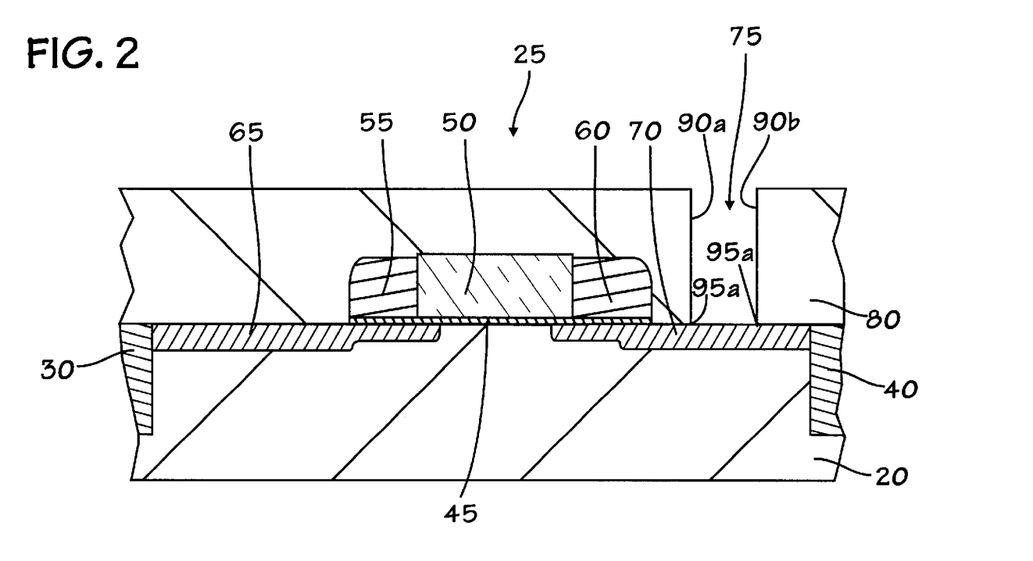
FIG. 2 is a cross-sectional view of the substrate of FIG. 1 depicting the formation of an opening in an insulating film on the substrate in accordance with the present invention.

An exemplary process flow for fabricating the tungsten conductor structure 10 in accordance with the present invention may be understood by referring now to FIGS. 2, 3, 4 and 5, and initially to FIG. 2. Initially, the opening 75 is established in the interlevel dielectric layer 80 by directional etching by, for example, chemical plasma etching, reactive ion etching, or the like. As the skilled artisan will appreciate, sometimes unavoidable variations in process control in the etching process may lead to topographical imperfections in the sidewalls 90a and 90b of the opening 75 and the upper surface of the source/drain region 70, and particularly at the lower corners 95a and 95b of the opening 75. Any such imperfections in the topography of the sidewalls 90a and 90b and/or the underlying source/drain region 70 may lead to variations in the thickness of the subsequently deposited barrier film 85.

Figure 3:
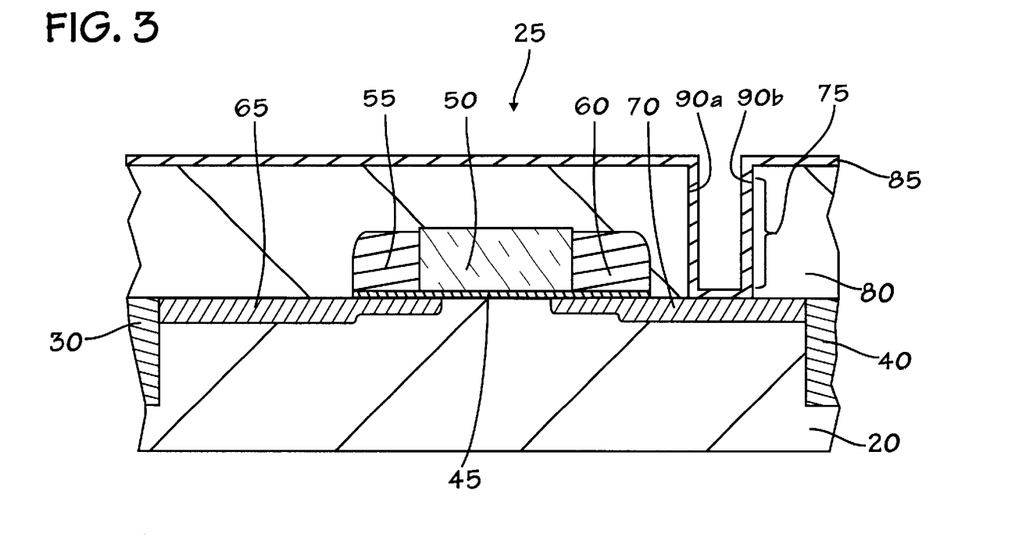
FIG. 3 is a cross-sectional view like FIG. 3 depicting the formation of a titanium and titanium nitride barrier film in the opening in accordance with the present invention.

Referring now to FIG. 3, the barrier film 85 is next formed by performing a physical vapor deposition of a thin film of titanium followed by a CVD or PVD film of titanium nitride on the titanium film to leave the completed barrier film 85. As noted above, any topographical imperfections in the sidewalls 90a and 90b of the opening 75 and/or the underlying source/drain region 70 may lead to variations in the thickness of the barrier film 85 within the confines of the opening 75. Such thin spots may be vulnerable to attack by fluorine atoms during the reduction of $WF_6$ in conjunction with the later deposition of tungsten.

Figure 4:
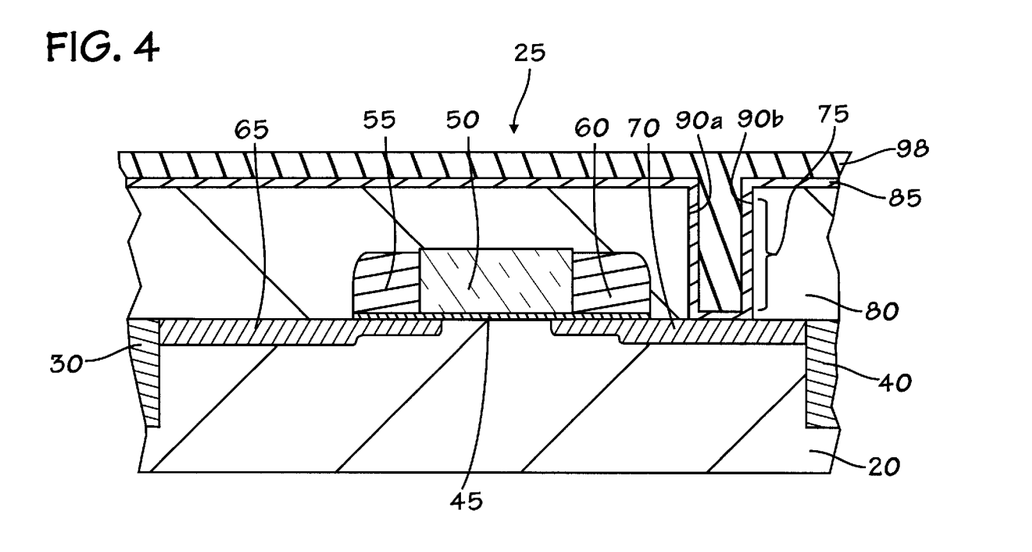
FIG. 4 is a cross-sectional view like FIG. 3 depicting the deposition of tungsten in the opening in accordance with the present invention.
Figure 5:
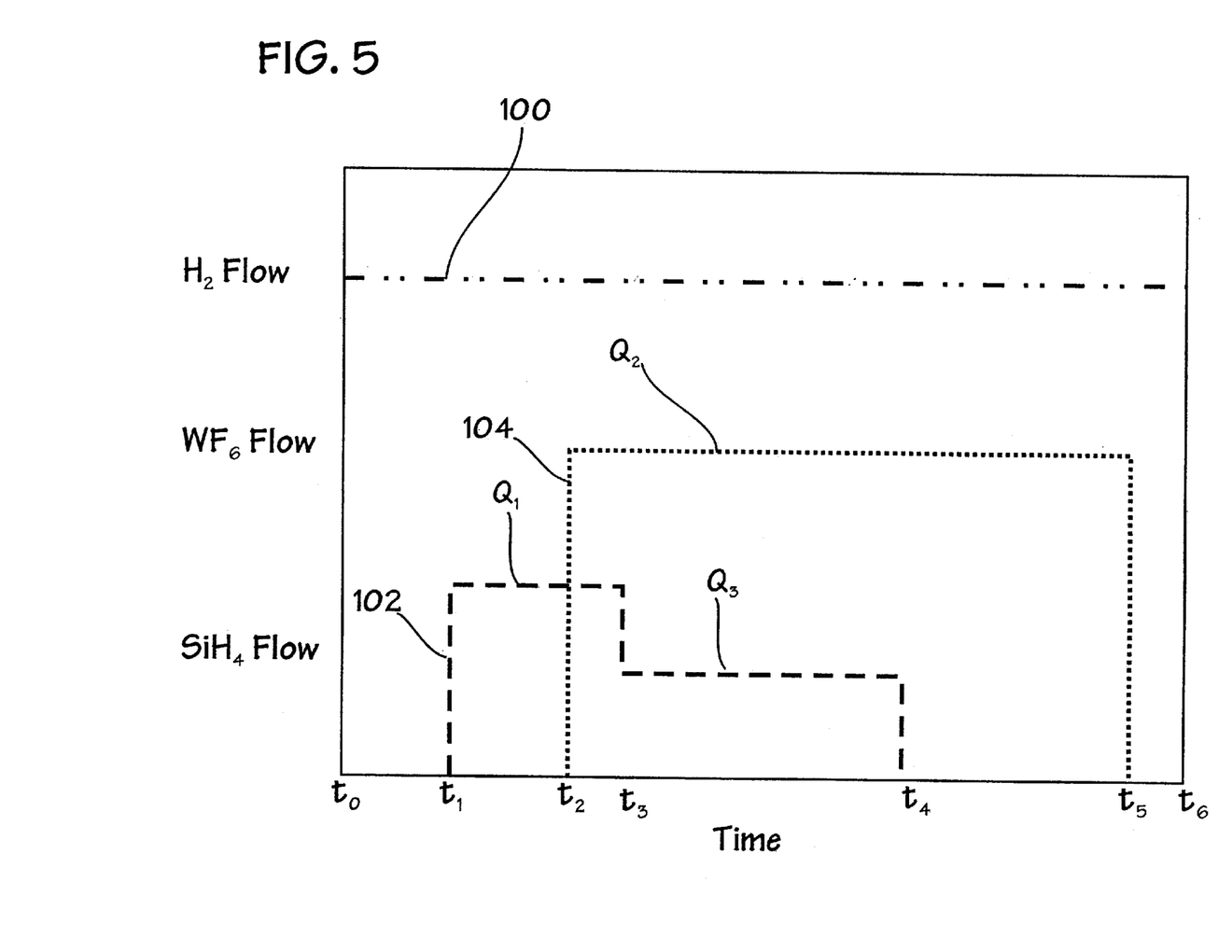
FIG. 5 is timing diagram depicting the sequence of gas flows during the tungsten deposition depicted in FIG. 4 in accordance with the present invention.

The fabrication of the tungsten conductor structure 10 depicted in FIG. 1 may be understood by referring now to FIGS. 4 and 5. The substrate 20 is placed in a chamber (not shown) and CVD is used to deposit a tungsten film 98. Through subsequent processing described below, the film 98 is planarized to yield the structure 10 depicted in FIG. 1. The first portion of the tungsten film 98 deposited constitutes a nucleation film of tungsten. The later deposited and thicker portion of the film 98 constitutes the bulk tungsten portion. The deposition process is designed to quickly establish the nucleation portion so that the underlying barrier film 85 is protected from fluorine diffusion and thereafter tailor the tungsten deposition rate to alleviate nonconformal deposition. In this regard, the barrier film 85 is exposed to a combination of hydrogen, silane, $WF_6$ and an inert carrier gas in a preselected combination and in a preselected profile. An exemplary gas flow profile is depicted in FIG. 5, which is a timing diagram showing the $H_2$, $WF_6$ and silane gas flows over a total time interval $t_0$ to $t_6$. The flow of hydrogen is represented by the plot 100, the flow of silane is represented by the plot 102 and the flow of $WF_6$ is represented by the plot 104. Initially, the barrier film 85 is heated to about 395 to 460° C. and advantageously to about 445° C. The temperature may vary with different tools. At a time $t_0$, a flow of hydrogen gas is initiated as represented by the plot 100. The flow rate of hydrogen is tool dependent and largely a matter of design discretion. In an exemplary embodiment the hydrogen flow rate may be maintained at a relatively constant level of about 6,000 to 8,000 sccm throughout the entire time interval $t_0$ to $t_6$. A flow of an inert carrier gas, such as argon, krypton or the like, is also maintained throughout the deposition process. The carrier gas flow rate may be about 9,000 to 10,000 sccm, but is tool dependent and a matter of design discretion. The total chamber pressure may be about 30 to 50 torr, but is tool dependent and a matter of design discretion.

At a time $t_1$, the barrier film 85 is exposed to a flow of silane at a first flow rate $Q_1$. This initial flow rate $Q_1$ for the silane may be about 30 to 40 seem, but is dependent upon the particular type of CVD tool employed. It is anticipated that other flow rates may be suitable as well, such as, for example, about 30 to 60 sccm.

At a time $t_1$, the flow of $WF_6$ is commenced at a flow rate $Q_2$. At this point, the $WF_6$ undergoes reduction by both the hydrogen and the silane, resulting in the deposition of tungsten on the film 85 and the liberation of fluorine. Most of the free fluorine reacts with hydrogen to form HF, which is pumped away from the chamber. At the time $t_1$, the silane concentration is high enough to quickly establish a thin tungsten nucleation film, which protects the underlying titanium nitride/titanium film 85 from attack by free fluorine atoms. The flow rate $Q_2$ of $WF_6$ is largely a matter of design discretion and will depend upon the particular tool utilized. In an exemplary embodiment, the flow rate $Q_2$ is about 350 to 500 sccm and advantageously about 400 sccm.

At a time $t_3$, which is later than the commencement of the $WF_6$ flow at time $t_2$, the flow rate of silane is reduced from $Q_1$ to a third flow rate $Q_3$. The magnitude of the third flow rate $Q_3$ is again largely a matter of design discretion, and dependent upon the type of tool utilized. In an exemplary embodiment the third flow rate $Q_3$ is about 15 to 20 sccm.

The flow of silane is terminated at a time $t_4$ and the flow of $WF_6$ is maintained thereafter until a time $t_5$. The process is completed at a time $t_6$.

The duration of the time interval for the flow rate $Q_2$ of $WF_6$, namely, $t_2$ to $t_5$ will largely determine the thickness of the deposited tungsten depicted in FIG. 4. This thickness, and thus the ultimate time interval $t_5$–$t_2$ are largely matters of design discretion.

Note that the time interval $t_1$ to $t_3$ of the high silane flow rate $Q_1$ and the time interval $t_2$ to $t_5$ of the $WF_6$ flow rate overlap for a short duration, namely from $t_2$ to $t_3$. This overlap between the high silane flow $Q_1$ and the $WF_6$ flow $Q_2$ ensures that silane is present along with $WF_6$ in a high enough concentration so that tungsten is deposited with a relatively high deposition rate along the sidewalls 90a and 90b and the bottom of the opening 75 and thus a thin nucleation tungsten film is quickly formed to protect the underlying barrier film 85 from fluorine attack. Whereas in the conventional tungsten deposition processes, the silane flow rate is maintained at a relatively constant level throughout the tungsten CVD process, the silane flow rate in the process according to the present invention is reduced from $Q_1$ to $Q_3$ momentarily after the commencement of the $WF_6$ flow rate $Q_2$. In this way, a high silane concentration is initially available for quick tungsten nucleation film formation but is thereafter reduced to avoid nonconformal tungsten formation within the opening 75 that might otherwise lead to void formation. The foregoing tungsten deposition process may be carried out in a Novellus Altus CVD chamber or any of a variety of other commercially available CVD tools.

An experiment was performed in a Novellus Altus CVD chamber utilizing eight test wafers. The test wafers were blanket coated with a titanium nitride/titanium barrier film, like the film 85 described above, and then subjected to blanket tungsten CVD according to the scheme set forth in the following table. The second column of the table shows the time interval from $t_2$ to $t_3$ and the fourth column shows the time interval from $t_3$ to $t_4$.

| Test Wafer No. | $t_2$...$t_3$(seconds) | $Q_1$ | $t_3$...$t_4$(seconds) | $Q_3$ |
| --- | --- | --- | --- | --- |
| 1 | 3 | 20 | 9 | 20 |
| 2 | 3 | 30 | 9 | 20 |
| 3 | 3 | 40 | 9 | 20 |
| 4 | 3 | 48 | 9 | 20 |
| 5 | 1 | 40 | 11 | 20 |
| 6 | 3 | 40 | 9 | 20 |
| 7 | 5 | 40 | 7 | 20 |
| 8 | 7 | 40 | 5 | 20 |

The CVD tungsten films formed during the test runs consisted of a thin tungsten nucleation layer with a nominal thickness of about 600 Å.

Figure 6:
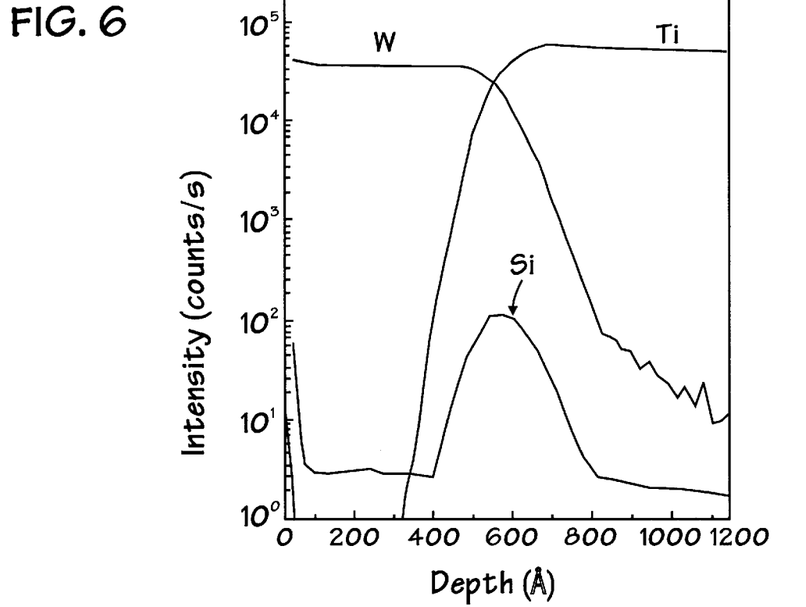
FIGS. 6, 7 and 8 are depth profile plots depicting the concentrations of silicon in tungsten-titanium nitride interfacial regions formed on a series of test wafers.

For each test wafer, secondary ion mass spectrometry (SIMS) in a Cameca IMS-6f instrument was used to characterize the silicon distribution at the CVD W/TiN interface. The results of the SIMS measurements are summarized in FIGS. 6, 7, 8 and 9. FIG. 6 is a plot of intensity versus depth and shows the SIMS depth profile for Test Wafer #1. Separate plots of tungsten, titanium and silicon are shown. A significant amount of silicon is aggregated at the CVD W/TiN interface at around 600 Å. This is due to the silane reduction of $WF_6$ during the interval $t_2$ to $t_3$. A knock on effect is manifested as a delay in the decay of the tungsten profile that is accompanied by a trailing into the TiN layer. Cascade mixing induced broadening also causes a rise in the titanium signal before the interface is reached.

Figure 7:
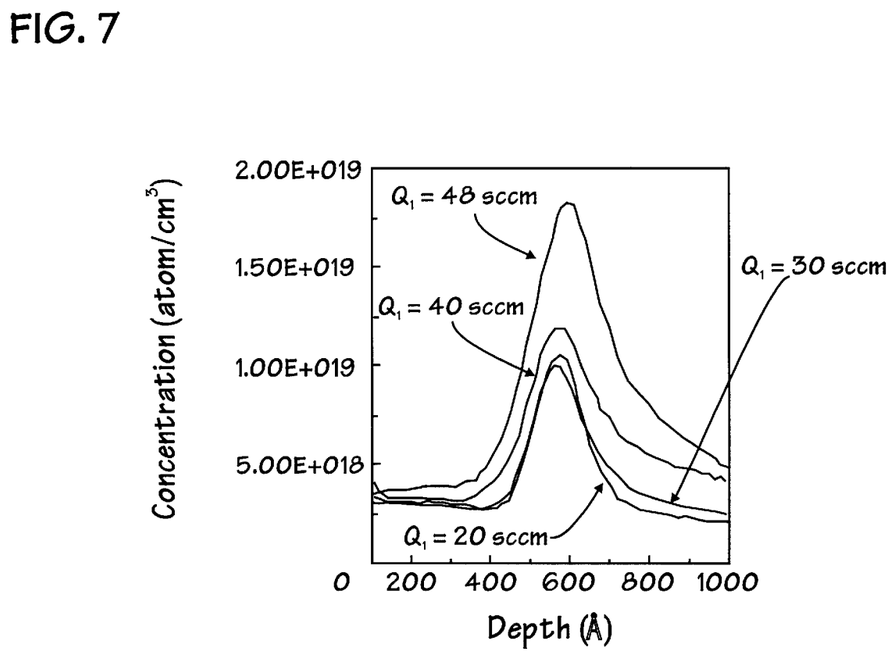

FIG. 7, shows the SIMS profiles for Test Wafer Nos. 1, 2, 3 and 4, and the corresponding silicon signals with various values of $Q_1$ and a constant time interval $t_2$ to $t_3$ of 3 seconds. Silicon is aggregated at the CVD W/TiN interface at around 600 Å. Increasing $Q_1$ from 20 to 30 sccm had little effect on the silicon concentration at the CVD W/TiN interface. However, the increase from 30 to 48 sccm produced a dramatic increase in silicon concentration.

Figure 8:
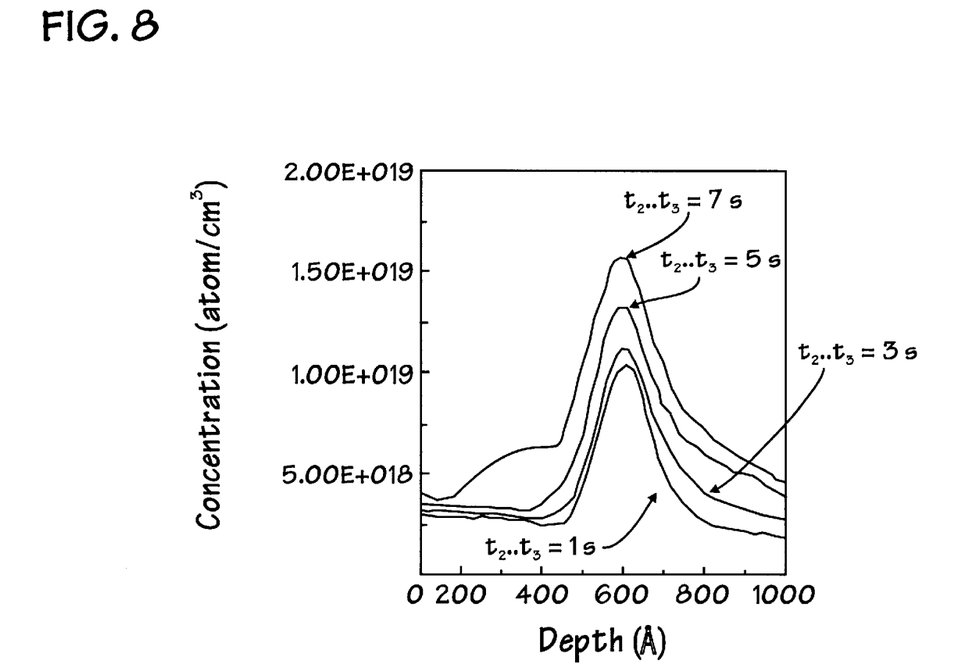

FIG. 8 shows the SIMS profiles for Test Wafer Nos. 5, 6 ,7 and 8, and the corresponding silicon signals with a constant value for $Q_1$ of 40 sccm and various values for the time interval $t_2$ to $t_3$. Silicon is again aggregated at the CVD W/TiN interface at around 600 Å. The silicon concentration at the CVD W/TiN increases gradually with increases in the time interval $t_2$ to $t_3$. The silicon concentration at a film depth of about 200 to 400 A also rises with increases in the time interval $t_2$ to $t_3$. This suggests that increasing the time interval only provides more silane at the CVD W/TiN interface to form nucleation sites, but also extends more silane reduction to the later phases of the tungsten deposition. This also suggests that variations in $Q_1$ do not change the deposition rate significantly.

Figure 9:
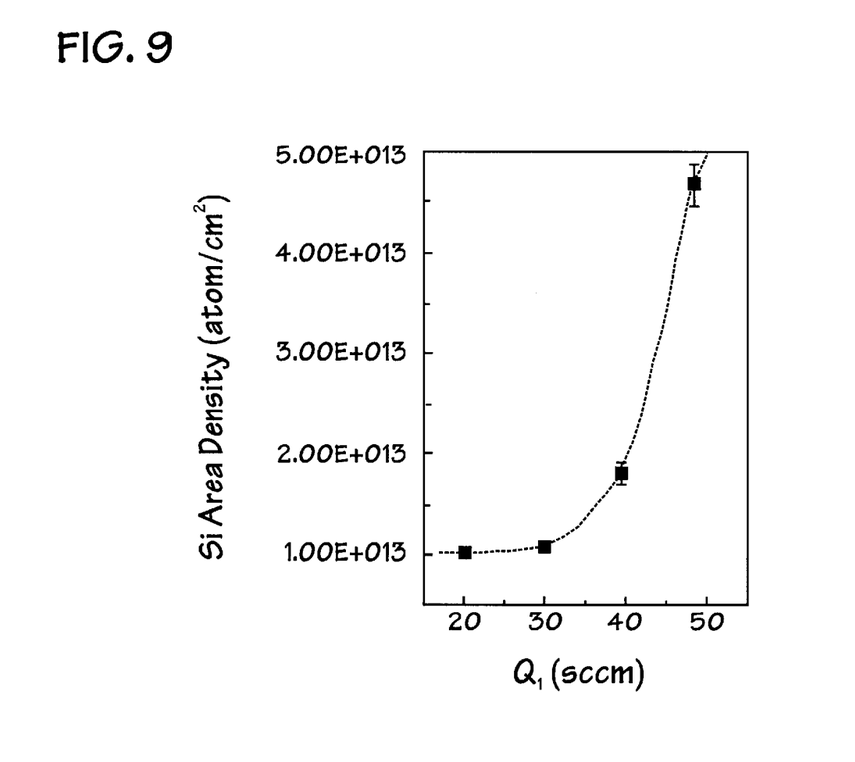
FIGS. 9 and 10 are silicon area density plots for the series of test wafers depicting the effects of varying silane flow rates and times.

FIG. 9 depicts the silicon area density versus $Q_1$ for Test Wafer Nos. 1, 2, 3 and 4. The plots show that silicon density varies little where $Q_1$ is increased from 20 to 30 sccm, but varies significantly from 30 to 48 sccm.

Figure 10:
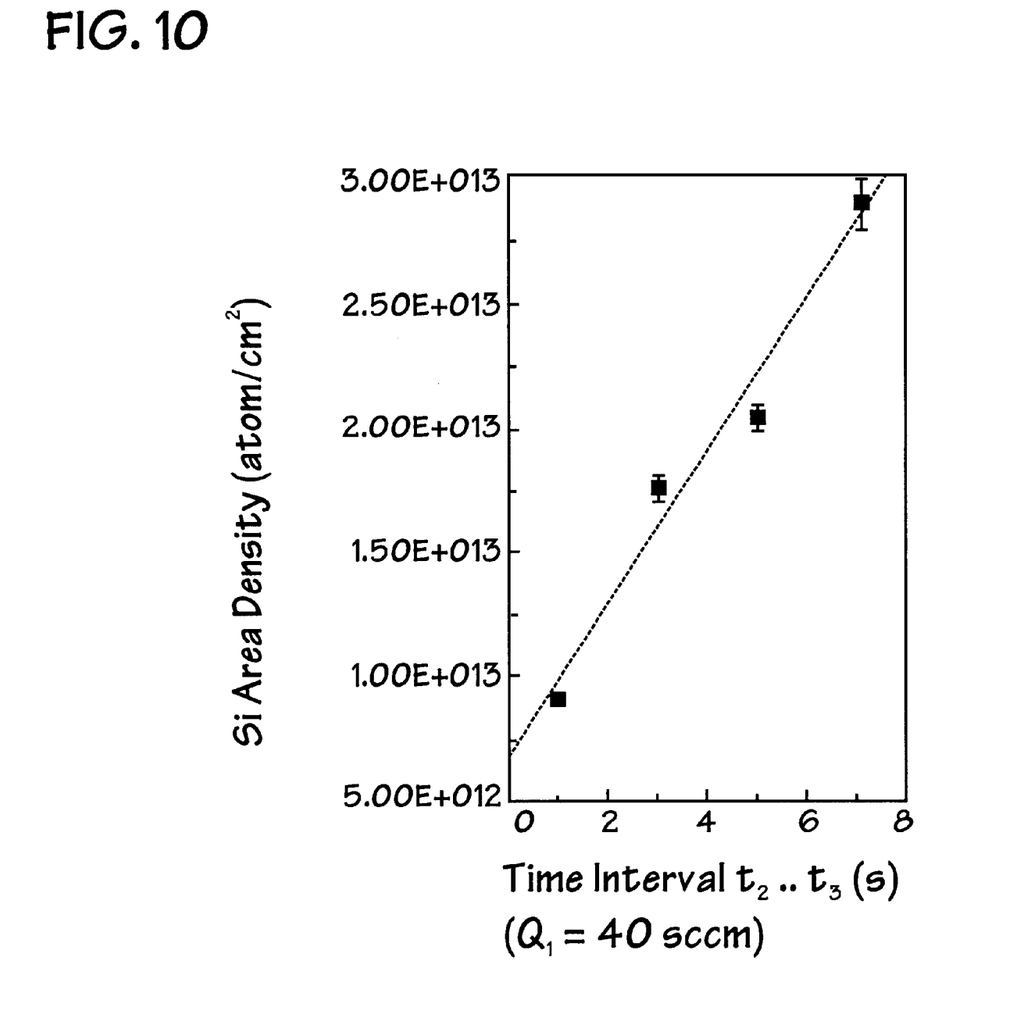

FIG. 10 depicts the silicon area density versus the time interval $t_2$ to $t_3$ for Test Wafer Nos. 5, 6, 7 and 8. The plots show silicon density increases linearly with increases in the time interval $t_2$ to $t_3$. In other words, the amount of silicon incorporated into the tungsten film during silane reduction of $WF_6$ increases linearly with silane flow time.

Referring again to FIG. 4, following the deposition of the tungsten film 98, a planarization process may be performed to yield the defined tungsten conductor structure 10 depicted in FIG. 1. Well known planarization techniques may be used, such as etchback planarization, chemical-mechanical-polishing, combinations of these or the like.

The skilled artisan will appreciate that the process of the present invention provides for the fabrication of tungsten conducting structures over titanium nitride films with reduced risk of fluorine diffusion and contact void formation. A two-level silane nucleation flow scheme is used to minimize fluorine diffusion through the rapid deposition rate of nucleation tungsten, and to alleviate void formation due to nonconformal tungsten deposition.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a tungsten structure, comprising:
   heating a titanium nitride film;
   exposing the titanium nitride film to a flow of hydrogen gas and a flow of an inert carrier gas;
   exposing the titanium nitride film to a flow of silane at a first flow rate for a first time interval;
   exposing the titanium nitride film to a flow of tungsten hexafluoride for a second time interval that begins after the beginning but prior to the end of the first time interval; and
   reducing the flow of silane at the end of the first time interval to a second flow rate and maintaining the second flow rate for a third time interval, wherein the third time interval ends before the second time interval ends.

2. The method of claim 1, wherein the flow of hydrogen gas is continuous during the flows of silane and tungsten hexafluoride.

3. The method of claim 1, wherein the first flow rate is about 30 to 60 sccm and the second flow rate is about 15 to 20 sccm.

4. The method of claim 3, wherein the flow rate of tungsten hexafluoride is about 350 to 500 sccm.

5. The method of claim 1, wherein the first and second time intervals overlap by about 1 to 4 seconds.

6. The method of claim 1, wherein the titanium nitride film is heated to about 395 to 460° C.

7. A method of fabricating a tungsten conductor structure in an opening in an insulating film, comprising:
   forming a titanium nitride film in the opening;
   heating the titanium nitride film;
   exposing the titanium nitride film to a flow of hydrogen gas and a flow of an inert carrier gas;
   exposing the titanium nitride film to a flow of silane at a fist flow rate for a first time interval;
   exposing the titanium nitride film to a flow of tungsten hexafluoride for a second time interval that begins after the beginning but prior to the end of the first time interval; and
   reducing the flow of silane at the end of the first time interval to a second flow rate and maintaining the second flow rate for a third time interval, wherein the third time internal ends before the second time interval ends.

8. The method of claim 7, wherein the flow of hydrogen gas is continuous during the flows of silane and tungsten hexafluoride.

9. The method of claim 7, wherein the first flow rate is about 30 to 60 sccm and the second flow rate is about 15 to 20 sccm.

10. The method of claim 9, wherein the flow rate of tungsten hexafluoride is about 350 to 500 sccm.

11. The method of claim 7, wherein the first and second time intervals overlap by about 1 to 4 seconds.

12. The method of claim 7, wherein the titanium nitride film is heated to about 395 to 460 ° C.

13. A method of fabricating a tungsten conductor structure in an opening in an oxide film, comprising:
   forming a titanium film in the opening;
   forming a titanium nitride film on the titanium film;
   heating the titanium nitride film;
   exposing the titanium nitride film to a flow of hydrogen gas and a flow of an inert carrier gas;
   exposing the titanium nitride film to a flow of silane at a first flow rate for a first time interval;
   exposing the titanium nitride film to a flow of tungsten hexafluoride for a second time interval that begins after the beginning but prior to the end of the first time interval; and
   reducing the flow of silane at the end of the first time interval to a second flow rate and maintaining the second flow rate for a third time interval, wherein the third time interval ends before the second time interval ends.

14. The method of claim 13, wherein the flow of hydrogen gas is continuous during the flows of silane and tungsten hexafluoride.

15. The method of claim 13, wherein the first flow rate is about 30 to 60 sccm and the second flow rate is about 15 to 20 sccm.

16. The method of claim 15, wherein the flow rate of tungsten hexafluoride is about 350 to 500 sccm.

17. The method of claim 13, wherein the first and second time intervals overlap by about 1 to 4 seconds.

18. The method of claim 13, wherein the titanium nitride film is heated to about 395 to 460° C.

* * * * *

UNITED STATES PATENT AND TRADEMARK OFFICE
CERTIFICATE OF CORRECTION

PATENT NO. : 6,277,744 B1
DATED : August 21, 2001
INVENTOR(S) : Ting H. Yuan et al.

It is certified that error appears in the above-identified patent and that said Letters Patent is hereby corrected as shown below:

Title page,
ABSTRACT, line 5, delete "a" after "heating the";

Column 1,
Line 11, delete "modem" and substitute -- modern -- therefor;

Column 7,
Line 8, after the word "interval" insert -- $t_2$ to $t_3$ not --;

Column 7, claim 3,
Lines 3 and 4, delete both occurrences of "seem" and substitute -- sccm -- therefor;

Column 8, claim 4,
Line 2, delete "seem" and substitute -- sccm -- therefor; and Column 8, claim 7,
Line 14, delete "fist" and substitute -- first -- therefor.

Signed and Sealed this

Nineteenth Day of March, 2002

Attest:

JAMES E. ROGAN
*Attesting Officer*    *Director of the United States Patent and Trademark Office*